United States Patent [19]

Woodward

[11] Patent Number: 5,001,675

[45] Date of Patent: Mar. 19, 1991

[54] PHASE AND AMPLITUDE CALIBRATION SYSTEM FOR ELECTROMAGNETIC PROPAGATION BASED EARTH FORMATION EVALUATION INSTRUMENTS

[75] Inventor: George H. Woodward, New Britain, Conn.

[73] Assignee: Teleco Oilfield Services Inc., Meriden, Conn.

[21] Appl. No.: 406,717

[22] Filed: Sep. 13, 1989

[51] Int. Cl.$^5$ .................... G01V 13/00; H04B 17/00
[52] U.S. Cl. ...................................... 367/13; 324/202
[58] Field of Search ................ 367/13; 324/202, 323, 324/338; 73/1 R; 250/252.1

[56] References Cited

U.S. PATENT DOCUMENTS

| | | | |
|---|---|---|---|
| 2,633,484 | 3/1953 | Zimmerman | 324/202 |
| 4,613,821 | 9/1986 | Sternberg et al. | 324/323 |
| 4,876,511 | 10/1989 | Clark | 324/338 |

Primary Examiner—Ian J. Lobo
Attorney, Agent, or Firm—Fishman, Dionne & Cantor

[57] ABSTRACT

A phase and amplitude calibration system for an electromagnetic propagation based earth formation evaluation tool is presented. In accordance with the present invention, improved phase and amplitude logs of a borehole section are provided by an automatic calibration system which compensates for errors caused by temperature and pressure variations in the borehole. This improvement is accomplished by applying in-phase, equal-amplitude reference signals to both measurement channels of a two channel system to thereby characterize system errors for correction of data used for logging. The reference signals are applied by tightly coupling a calibration signal to each receiving antenna. In a first embodiment, this is accomplished by adding a second antenna (a calibration antenna) to each of the two spaced receiving antennas. Each of the calibration antennas communicates with an attenuator which acts to make the calibration antenna transparent or invisible to the receiving antenna when the receiving antenna is in the measurement mode. The attenuator also sets the signal level delivered to the calibration antenna to a value that the receiving antenna would normally see in a measurement mode. In a second and preferred embodiment, the electrostatic shield surrounding each receiving antenna is used as a calibration antenna. The attenuator is then connected across the gap of the shield.

35 Claims, 2 Drawing Sheets

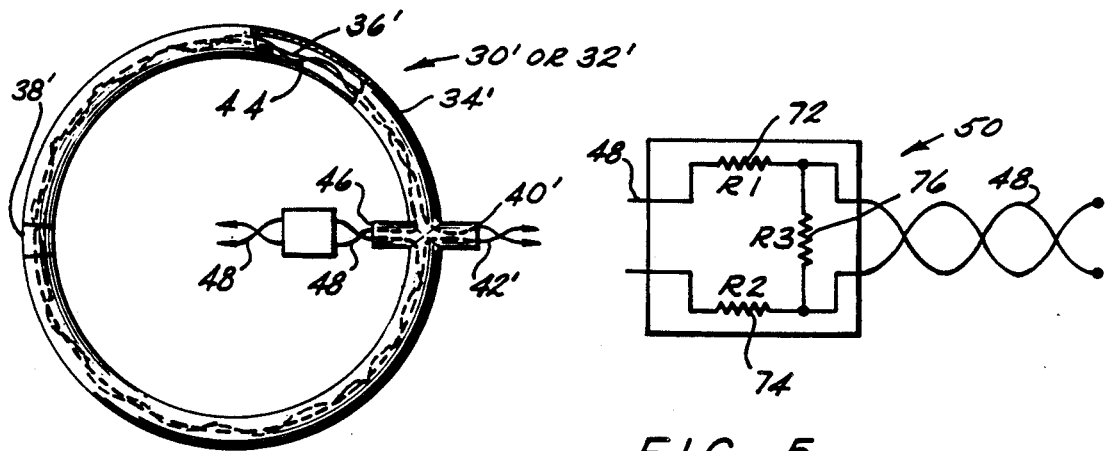
FIG. 4
FIG. 5
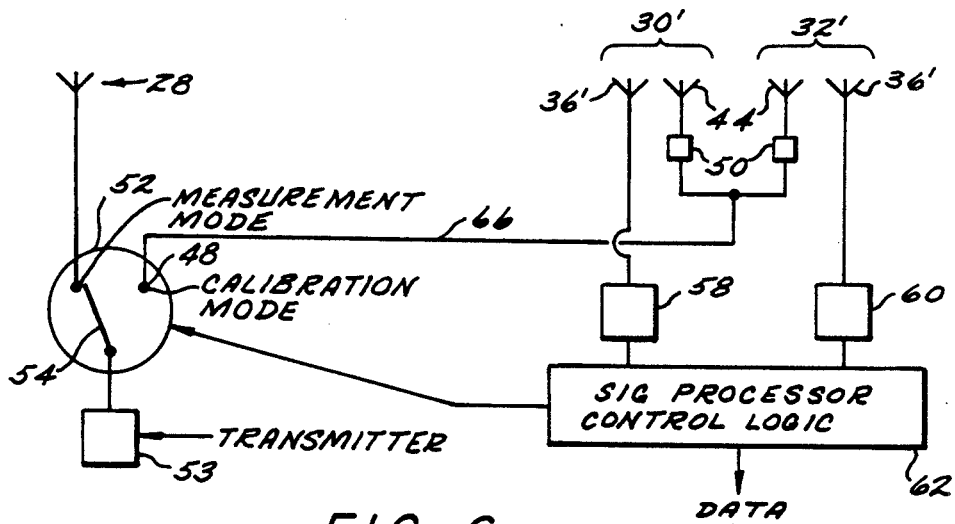
FIG. 6
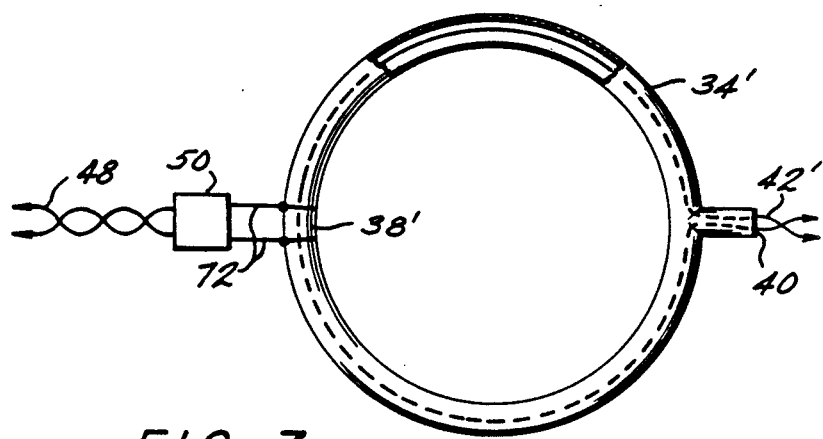
FIG. 7

PHASE AND AMPLITUDE CALIBRATION SYSTEM FOR ELECTROMAGNETIC PROPAGATION BASED EARTH FORMATION EVALUATION INSTRUMENTS

BACKGROUND OF THE INVENTION:

This invention relates generally to borehole formation evaluation instrumentation. More particularly, this invention relates to a new and improved calibration system for use in an electromagnetic propagation based borehole formation evaluation instrument used primarily in oil and gas well drilling applications.

Borehole formation evaluation tools are known which measure phase and/or amplitude of electromagnetic waves to determine an electrical property (such as resistivity or permittivity) of a section of a borehole. Typically, the existing tools used for this application are composed of one or more transmitting antennas spaced from one or more pairs of receiving antennas. An electromagnetic wave is propagated from the transmitting antenna into the formation surrounding the borehole and is detected as it passes by the two receiving antennas. In a resistivity measuring tool, magnetic dipoles are employed which operate in the mf and lower hf spectrum. In contrast, permittivity tools utilize electric dipoles in the VHF or UHF ranges.

In a known resistivity sensor of the type hereinabove discussed which is used by Teleco Oilfield Services Inc., assignee of the present application, the resistivity sensor measures both phase difference and amplitude ratio to provide two resistivities with different depths of investigation. A signal received in a first receiving antenna is shifted in phase and its amplitude will be less than the signal received in a second receiving antenna. Resistivities are then derived from both the phase difference and the amplitude ratio of the received signals. This differential measurement is primarily responsive to the formation opposite the receiving antennas and is less sensitive to the borehole and/or variations in the transmitted signal as in prior art sensing devices.

While well suited for its intended purposes, a problem with existing electromagnetic propagation sensors of the type described herein consists of measurement uncertainty introduced by phase and amplitude differentials between the two measurement channels. A measurement channel includes a receiving antenna, a radio receiver and such signal processing means as may be necessary to determine the phase and amplitude of the received signal relative to the other channel or a known reference. Phase and amplitude differentials can occur with antenna deformation caused by borehole temperature and pressure variations, antenna insulator deterioration or thermal drift of the electronic components.

Such phase and amplitude differentials become more difficult to compensate through ordinary means (such as increased mechanical precision and ruggedness or electronic component matching) as the measurement bandwidth is reduced. This is because narrow bandwidth channels are more sensitive to thermal and mechanical changes than are wide bandwidth channels. As a result, efforts to improve measurement resolution (i.e., the ability to log small changes in the formation characteristics) by decreasing the system bandwidth are frustrated by the reduced overall accuracy introduced by phase and amplitude differentials. One problematic manifestation of this differential effect is "divergence" of the phase and amplitude logs of a borehole section. Such "divergence" reduces the confidence of the formation evaluation and thereby forces the allowance of a wide error band in the log interpretation.

One prior art solution to the phase and amplitude differential problem is the Compensated Dual Resistivity sensor. This device employs transmitting antennas at each end of the drill collar, with a pair of receiving antennas located centrally between them. By firing one transmitting antenna and then the other, the two differential measurements will have equal and opposite error components. Averaging the two measurements cancels the errors. This type of sensor is by necessity about one meter longer than the analogous electromagnetic propagation type tool used by Teleco Oilfield Services, Inc. There are a number of disadvantages associated with this greater length. Significantly, higher drill collar weight, higher material and machining costs, more difficult transportation, storage and handling considerations, as well as a somewhat reduced immunity to invasion effects. This is because the measurement occurs farther from the bit. In addition, at slow penetration rates, drilling mud can invade the formation before the sensor can log it.

SUMMARY OF THE INVENTION:

The above discussed and other problems and deficiencies of the prior art are overcome or alleviated by the phase and amplitude calibration system for an electromagnetic propagation based earth formation evaluation tool of the present invention. In accordance with the present invention, improved phase and amplitude logs of a borehole section are provided by an automatic calibration system which compensates for errors caused by temperature and pressure variations in the borehole. This improvement is accomplished by applying in-phase, equal-amplitude reference signals to both measurement channels of a two channel system to thereby characterize system errors for correction of data used for logging. The reference signals are applied by tightly coupling a calibration signal to each receiving antenna. In a first embodiment, this is accomplished by adding a second antenna (a calibration antenna) to each of the two spaced receiving antennas. Each of the calibration antennas communicates with an attenuator which acts to make the calibration antenna transparent or invisible to the receiving antenna when the receiving antenna is in the measurement mode. The attenuator also sets the signal level delivered to the calibration antenna to a value that the receiving antenna would normally see in a measurement mode.

In a second and preferred embodiment, the electrostatic shield surrounding each receiving antenna is used as a calibration antenna. The attenuator is then connected across the gap of the shield.

The above-discussed and other features and advantages of the present invention will be appreciated and understood by those skilled in the art from the following detailed description and drawings.

BRIEF DESCRIPTION OF THE DRAWINGS:

Referring now to the drawings wherein like elements are numbered alike in the several FIGURES:

FIG. 4 is a plan view, partly broken away, of a receiving antenna used in an electromagnetic resistivity tool in accordance with the present invention;

FIG. 5 is an electrical schematic of an attenuator used in the calibration system of the present invention;

FIG. 6 is a block diagram of the calibration system in accordance with the present invention; and FIG. 7 is a schematic plan view, partly broken away of a receiving antenna in accordance with a second embodiment of the present invention;

Figure 1:
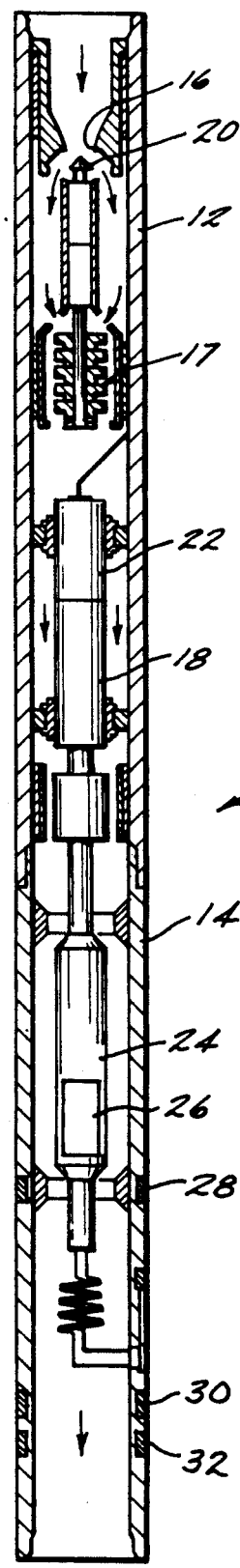
FIG. 1 is a longitudinal view through a known electromagnetic tool.

DESCRIPTION OF THE PREFERRED EMBODIMENT:

Referring first to FIG. 1, an electromagnetic propagation resistivity tool used by Teleco Oilfield Services, Inc. is shown generally at 10. Tool 10 comprises a pair of drill collar segments 12 and 14. As is well known, drilling fluid or mud is pumped within the drillstring as indicated by the arrows in FIG. 1. The mud flows through a variable flow orifice 16 and is delivered to drive a first turbine 17. This first turbine 17 powers a generator which delivers electrical power to the sensors in a sensor unit 18. The output from sensor unit 18, which may be in the form of electrical, hydraulic or similar signals, operates a plunger 20 which varies the size of variable orifice 16, plunger 20 having a valve driver which may be hydraulically or electrically operated. Variations in the size of orifice 16 create pressure pulses in the mud stream which are transmitted to and sensed at the surface to provide indications of various conditions sensed by sensor unit 18. This activity is directed by a microprocessor and electronics unit 22.

Since sensors in sensor unit 18 are magnetically sensitive, the particular drillstring segment 12 which houses the sensor elements must be a non-magnetic section of the drillstring, preferably of stainless steel or monel.

In drillstring segment 14, a known gamma ray and resistivity electronics package 24 is also housed in a non-magnetic drillstring section. Below a gamma sensor 26 is located the electromagnetic propagation resistivity sensor. This comprises a transmitting antenna 28 which is spaced upwardly from two spaced receiving antennas 30 and 32. A memory port 33 communicates with the electronics for fast retrival of stored data when the tool 10 is brought to the surface.

Figure 2:
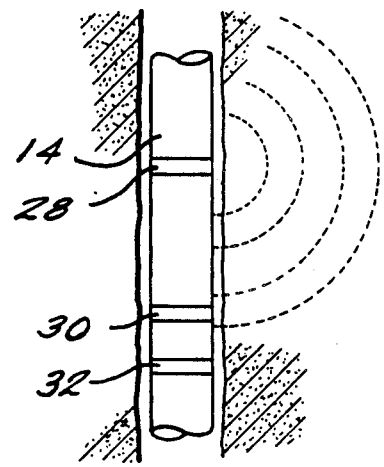
FIG. 2 is a longitudinal schematic view depicting the operation of an electromagnetic resistivity sensor.

Referring now also to FIG. 2, the resistivity sensor measures both phase difference and amplitude ratio to provide two apparent resistivities with different depths of investigation. For example, in FIG. 2, a two MHz wave is propagated by transmitting antenna 28 from a transmitter in the tool into the formation and it is detected as it passes the two receivers 30 and 32. The signal at the far receiver 32 is shifted in phase and its amplitude is less than the signal on the near receiver 30. Resistivities are derived from both the phase difference and the amplitude ratio of the received signals. This differential measurement is primarily responsive to the formation opposite the receivers 30 and 32 and is less sensitive to the borehole and/or variations in the transmitted signals.

Figure 3:
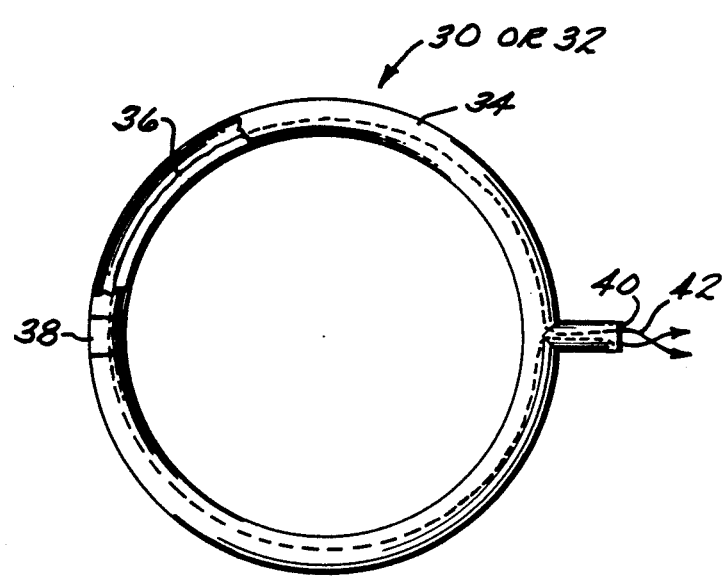
FIG. 3 is a plan view, partly broken away, of a receiving antenna used in accordance with prior art electromagnetic resistivity tools.

Turning now to FIG. 3, a receiving antenna 30 or 32 in accordance with the prior art magnetic resistivity measurement instrumentation of FIG. 1 is shown. Prior art receiver 30 or 32 comprises an electrostatic shield 34 (which is preferably composed of copper) which surrounds a magnetic dipole antenna 36. Shield 34 includes a gap therein which is insulated using a ceramic annular plug 38. Electrostatic shield 34 also includes an exit port 40 which is located in a position opposed to insulative ceramic gap 38. Magnetic dipole antenna 36 exits port 40 by means of a transmission line 42. In turn, transmission line 42 is connected to a radio receiver; or in some cases may be directly connected to a receiver located within the electrostatic shield 34. Alternatively, an inductive device may be used to couple the signal from antenna 36 to the transmission line 42 or to a radio receiver.

While well suited for its intended purposes, the electromagnetic resistivity tool of FIGS. 1-3 does suffer from certain deficiencies derived from measurement uncertainty introduced by phase and amplitude differentials between the two measurement channels wherein each measurement channel includes a receiving antenna 30 or 32, a radio receiver and such signal processing as may be necessary to determine the phase and amplitude of the received signal relative to the other channel or known reference. It will be appreciated that phase and amplitude differentials can occur with antenna deformation caused by borehole temperature and pressure variations, antenna insulator deterioration or thermal drift of the electronic components. Such differentials are difficult to compensate through ordinary means particularly as the measurement bandwidth is reduced. As a result, known electromagnetic resistivity tools may provide undesirable divergence in the phase and amplitude logs of a borehole section. Such divergence will, of course, reduce the confidence of the formation evaluation and thereby force the allowance of a wide error band in the log interpretation.

The present invention overcomes this important drawback and deficiency of the prior art by tightly coupling a calibration antenna to each receiving antenna. Referring to FIG. 4, a receiving antenna 30' or 32' is shown which includes the electrostatic shield 34' surrounding a magnetic dipole antenna 36' as in the prior art. In addition, a ceramic plug 38' insulates a gap in electrostatic shield 34' and an output port 40' houses a transmission line 42' (e.g. twisted pair wire). However, in contrast to prior art FIG. 3, in FIG. 4, and in accordance with the calibration system of the present invention, a second magnetic dipole antenna 44 is tightly coupled to receiving antenna 36' and is connected at an output port 46 (via a transmission line 48) to an attenuator 50. From attenuator 50, transmission line 48 communicates with a calibration signal source identified generally at 52 in FIG. 6. It will be appreciated that various means may be used to ensure constant tight magnetic coupling between receiving antenna 36' and calibration antenna 44. For example, such tight coupling can be accomplished by molding the conductors into a ribbon cable, forming the conductors into a twisted pair or by forming the two antennas as a coaxial cable. In this latter embodiment, the calibration antenna would form the inner conductor while the receiving antenna would form the outer shield of the coaxial cable. No matter which coupling scheme is used, it is important that the antennas 36' and 44 be within a common electrostatic shield so that the coefficient of coupling is not a function of loop deformation as might occur as a result of borehole temperature or hydraulic pressure variations.

Turning now to FIG. 6, a block diagram depicting the electrical configuration of the calibration system of the present invention is shown. This block diagram includes a transmitting antenna 28 and a pair of receiving antennas 30' and 32'. As diagrammatically shown, each receiving antenna 30' and 32' comprises a magnetic dipole antenna 36' which is tightly coupled to a magnetic dipole calibration antenna 44. In turn, each calibration antenna 44 communicates with an attenuator 50. A transmission line from attenuator 50 communicates with calibration signal source 52 which in turns connects to transmitting antenna 28 and transmitter 53. A switch 54 on calibration signal source 52 permits transmitting antenna 28 to operate between a calibration mode and a measurement mode. Each receiving antenna 30 and 32 communicates with a known receiver such as a single frequency radio receiver 58 and 60. Radio receivers 58 and 60 communicate with a signal processor control logic device (computer) 62 which both outputs data and inputs information to calibration signal source 52.

Attenuator 50 presents a large input resistance (relative to the radiation resistance of the loop) to the calibration antenna feedpoint 48. This intentional impedance mismatch limits the current in the calibration antenna 44 to an infinitessimal fraction of that induced in the receiving antenna 36' when the assembly of FIG. 3 is excited by the electromagnetic wave propagated from transmitting antenna 28. The attenuator is important for at least two reasons including, (1) the attenuator makes the calibration antenna transparent or invisible to the receiving antenna when the receiving antenna is in a measurement mode and (2) the attenuator sets the signal level delivered to the calibration antenna to evaluate what the receiving antenna would normally see in a measurement mode.

During operation, a signal from transmitter 53 is initially shunted via switch 54 from the formation and sent from transmitter 53 through wires 66 in the tool, through attenuators 50 and into the tightly coupled receiving and calibration antennas 30' and 32'. As mentioned, the calibration and receiving antennas 44' and 36' must be tightly coupled so that the formation does not influence the reading. The signal received in the tightly coupled antennas is then sensed by receivers 58 and 60 and sent to the signal processor 62. The signals transmitted by the calibration antennas 44 are equal in phase and equal in amplitude. The resulting data output from processor 62 is equal to the error caused by temperature and Pressure variations as described above.

Next, switch 54 connects transmitter 53 to transmitting antenna 28 and a signal is sent from the transmitting antenna 28 through the formation to receiving antennas 30' and 32' in the usual manner. The data output received from such a measurement will then have an error which may be subtracted out using the calibrated error number to derive an error free reading.

Turning now to FIG. 7, in a second embodiment of the present invention, rather than using a discrete calibration antenna 44 as in the FIG. 4 embodiment, the calibration signal is coupled into the receiving antenna 36' through attenuator 50 and transmission line 48 which is connected across the gap 38' in electrostatic shield 34'. In this way, the electrostatic shield 34' will act as the calibration antenna rather than using the discrete calibration antenna 44 of the FIG. 4 embodiment. This is a preferred embodiment of the present invention since the electrostatic shield 34' is already an existing part of the electromagnetic resistivity tool and therefore calibration is accomplished using a calibration antenna which is already present in the known system.

As shown in FIG. 5, attenuator 50 preferably comprises three resistors 72, 74 and 76 wherein resistor 76 is connected in parallel with transmission line 66 and resistors 72 and 74 are connected in series with the calibration antenna 44 or electrostatic shield 34. Preferably, resistor 72 and 74 of attenuator 50 should be many times higher in value than the radiation resistance presented by electrostatic shield 34' as measured across gap 38'. Therefore, the connection will not measurably degrade the signal that is delivered to the receiver when the receiving antenna 36' is excited by a magnetic wave propagated from the transmitting antenna. Resistors 72 and 74 should be closely matched in value and arranged symmetrically about shield gap 38' so as not to upset the electrical balance of antenna 36' or shield 34' with respect to the transmission line 42' (or the inductive coupling means if such is used). The third resistor 76 has a much lower value relative to resistor 72 and 74 so as to effect a reasonably well-matched termination for the calibration transmission line 66. In a preferred embodiment, both resistors 72 and 74 are 10K Ohm resistors while resistors 76 is a 100 Ohm resistor. The three resistor network 72, 74 and 76 of attenuator 50 may be used in both the attenuator shown in the FIG. 4 and FIG. 7 embodiment of the present invention. Preferably, attenuator 50 is made integral with the ceramic gap insulator 38'. The three resistors in such an embodiment may comprise discrete chip resistors adhesively bonded to the insulator. Preferably, each resistor 70, 72 and 74 comprises a film resistor which is fired onto the ceramic gap insulator.

Thus, in accordance with the present invention, errors induced in the receiving antennas of a known electromagnetic resistivity tool may be calibrated out in a simple and efficient manner. As a result, a narrow bandwidth system may be utilized which can be much more sharply tuned relative to the prior art. The advantage of such a narrow band system is an improvement to the signal-to-noise ratio which leads to finer resolution measurements or alternatively, lower transmitter power can be used to make measurements equal in resolution to prior art instruments.

It will be appreciated that while the present invention has been shown in conjunction with a resistivity tool, a person of ordinary skill in the art will recognize that the present invention may equally apply to permittivity measurements using electromagnetic propagation based instrumentation.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of calibrating an electromagnetic propagation based earth formation evaluation instrument, the instrument including a drillstring segment having at least one transmitting antenna and at least one pair of spaced receiving antennas, including the steps of:

tightly coupling calibration antenna means to each receiving antenna to define at least one pair of coupled calibration/receiving antennas;

transmitting in-phase, equal-amplitude reference signals to each calibration receiving antenna;

sensing the reference signals transmitted to said calibration/receiving antennas;
delivering said sensed reference signals to microprocessor means; and
calculating an error output from a comparison of the sensed reference signals using said microprocessor means.

2. The method of claim 1 including:
transmitting a measurement signal through the transmitting antenna;
sensing the measurement signal through the pair of receiving antennas and calculating a formation evaluation output; and
subtracting the error output from the formation evaluation output to define an error free output.

3. The method of claim 1 wherein the receiving antennas each comprise a first magnetic dipole antenna surrounded by an electrostatic shield and wherein said coupling step comprises:
coupling a second magnetic dipole antenna to the first magnetic dipole antenna within the electrostatic shield, said second magnetic dipole antenna defining said calibration antenna means.

4. The method of claim 1 wherein the receiving antennas each comprise a first magnetic dipole antenna surrounded by an electrostatic shield, the shield including an insulated gap, and wherein said coupling step comprises:
coupling the electrostatic shield across the insulated gap to the magnetic dipole antenna, said electrostatic shield defining said calibration antenna means.

5. The method of claim 1 including transmitting means for transmitting said reference signals and further including:
electrically isolating said transmitting antenna from said transmitting means when transmitting said reference signals to each calibration/receiving antenna.

6. The method of claim 1 including:
calibrating said electromagnetic propagation based earth formation evaluation instrument when said instrument is positioned in a borehole.

7. A calibration system for an electromagnetic propagation based earth formation evaluation instrument, the instrument including a drillstring segment having a transmitter normally connected to at least one transmitting antenna and at least one pair of spaced receiving antennas, comprising:
calibration antenna means tightly coupled to each receiving antenna to define at least one pair of coupled calibration/receiving antennas;
transmitting means for transmitting in-phase, equal-amplitude reference signals from the transmitter to each calibration/receiving antenna;
sensing means for sensing the reference signals transmitted to the calibration/receiving antennas; and
microprocessor means for calculating an error output from a comparison of the sensed reference signals.

8. The system of claim 7 wherein the receiving antennas each comprise a first magnetic dipole antenna surrounded by an electrostatic sheath and wherein said calibration antenna means comprises:
a second magnetic dipole antenna coupled to said first magnetic dipole antenna within the electrostatic sheath.

9. The system of claim 8 wherein:
said first and second magnetic dipole antenna are configured as twisted pair wires.

10. The system of claim 8 wherein:
said first and second magnetic dipole antennas are configured as ribbon cable.

11. The system of claim 8 wherein:
said first and second magnetic dipole antennas are configured as coaxial cable.

12. The system of claim 7 wherein the receiving antennas each comprise a magnetic dipole antenna surrounded by an electrostatic sheath, the electrostatic sheath including an insulated gap and wherein:
said calibration antenna means comprises said electrostatic sheath, said reference antenna means being coupled to said magnetic dipole means across the insulated gap of the electrostatic sheath.

13. The system of claim 7 wherein said transmitting means includes attenuator means.

14. The system of claim 13 wherein said attenuator means comprises:
first and second resistors having substantially the same value; and
a third resistor connected to said first and second resistors, said third resistor having a lower value relative to said first and second resistors.

15. The system of claim 14 wherein an electrostatic sheath surrounds the receiving antenna, the electrostatic sheath including a gap having an insulator in said gap, and wherein:
said first, second and third resistors comprise discrete chip or film resistors attached to said gap insulator.

16. The system of claim 14 wherein:
said first and second resistors have values of about 10,000 Ohm; and
said third resistor has a value of about 100 Ohm.

17. The system of claim 14 wherein:
said first and second resistors are connected in series to said calibration antenna means; and
said third resistor is connected in parallel to a transmission line, said transmission line being connected to said calibration antenna means.

18. The system of claim 7 including:
means for switching the transmitter between a measurement mode and a calibration mode.

19. The system of claim 7 including:
means for subtracting said error output from formation evaluation output.

20. The system of claim 7 including:
means for electrically isolating said transmitting antenna from said transmitting means when transmitting said reference signals to each calibration/receiving antenna.

21. The system of claim 7 including:
said calibration system is integral to said electromagnetic propagation based earth formation evaluation tool.

22. A method of calibrating an electromagnetic propagation based earth formation evaluation instrument, the instrument including a drillstring segment having at least one transmitting antenna and at least one pair of spaced receiving antennas, including the steps of:
tightly coupling a calibration signal to each receiving antenna to define in-phase, equal-amplitude reference signals;
sensing the reference signals;
delivering said sensed reference signals to microprocessor means; and calculating an error output from a comparison of the sensed reference signals using said microprocessor means.

23. The method of claim 22 including transmitting means for transmitting said reference signals and further including:
electrically isolating said transmitting antenna from said transmitting means when transmitting said reference signals to each calibration/receiving antenna.

24. The method of claim 22 including:
calibrating said electromagnetic propagation based earth formation evaluation instrument when said instrument is positioned in a borehole.

25. A system of calibrating an electromagnetic propagation based earth formation evaluation instrument, the instrument including a drillstring segment having at least one transmitting antenna and at least one pair of spaced receiving antennas, including the steps of:
means for tightly coupling a reference signal to each receiving antenna to define in-phase, equal-amplitude reference signals;
sensing means for sensing the reference signals; and
microprocessor means for calculating an error output from a comparison of the sensed reference signals.

26. The system of claim 25 including:
means for electrically isolating said transmitting antenna from said transmitting means when transmitting said reference signals to each calibration/receiving antenna.

27. The system of claim 25 wherein:
said calibration system is integral to said electromagnetic propagation based earth formation evaluation tool.

28. A method of calibrating an electromagnetic propagation based earth formation evaluation instrument, the instrument including a drillstring segment having at least one transmitting antenna and at least one pair of spaced receiving antennas, including the steps of:
tightly coupling calibration antenna means to each receiving antenna to define at least one pair of coupled calibration/receiving antennas;
transmitting reference signals to each calibration/receiving antennas, said reference signals having known pre-selected phase and amplitude relationships;
sensing the reference signals transmitted to said calibration/receiving antennas;
delivering said sensed reference signals to microprocessor means; and
calculating an error output from a comparison of the sensed reference signals using said microprocessor means.

29. The method of claim 28 wherein:
said known phase and amplitude relationships comprise in-phase, equal-amplitude relationships.

30. A calibration system for an electromagnetic propagation based earth formation evaluation instrument, the instrument including a drillstring segment having a transmitter normally connected to at least one transmitting antenna and at least one pair of spaced receiving antennas, comprising:
calibration antenna means tightly coupled to each receiving antenna to define at least one pair of coupled calibration/receiving antennas;
transmitting means for transmitting reference signals from the transmitter to each calibration receiving antenna, said reference signals having known pre-selected phase and amplitude relationships; and
sensing means for sensing the reference signals transmitted to the calibration/receiving antennas; and
microprocessor means for calculating an error output from a comparison of the sensed reference signals.

31. The method of claim 30 wherein:
said known phase and amplitude relationships comprise in-phase, equal-amplitude relationships.

32. A method of calibrating an electromagnetic propagation based earth formation evaluation instrument, the instrument including a drillstring segment having at least one transmitting antenna and at least one pair of spaced receiving antennas, including the steps of:
tightly coupling a reference signal to each receiving antenna to define reference signals having known pre-selected phase and amplitude relationships;
sensing the reference signals; and
delivering said sensed reference signals to microprocessor means; and
calculating an error output from the sensed reference signals using said microprocessor means.

33. The method of claim 32 wherein:
said known phase and amplitude relationships comprise in-phase, equal-amplitude relationships.

34. A system of calibrating an electromagnetic propagation based earth formation evaluation instrument, the instrument including a drillstring segment having at least one transmitting antenna and at least one pair of spaced receiving antennas, including the steps of:
means for tightly coupling a reference signal to each receiving antenna to define reference signals having known pre-selected phase and amplitude relationships;
sensing means for sensing the reference signals; and
microprocessor means for calculating an error output from a comparison of the sensed reference signal.

35. The method of claim 34 wherein:
said known phase and amplitude relationships comprise in-phase, equal-amplitude relationships.

* * * * *

UNITED STATES PATENT AND TRADEMARK OFFICE
CERTIFICATE OF CORRECTION

PATENT NO. : 5,001,675  
DATED : March 19, 1991  
INVENTOR(S) : George H. Woodward Page 1 of 1

It is certified that error appears in the above-identified patent and that said Letters Patent is hereby corrected as shown below:

<u>Column 8,</u>  
Line 54, delete "including" and insert therefor -- wherein --

<u>Column 10,</u>  
Line 51, delete "method" and insert therefor -- system --

Signed and Sealed this

Nineteenth Day of March, 2002

Attest:

JAMES E. ROGAN  
*Director of the United States Patent and Trademark Office*

*Attesting Officer*